(12) United States Patent
Wu

(10) Patent No.: US 6,586,303 B2
(45) Date of Patent: Jul. 1, 2003

(54) METHOD FOR FABRICATING A MASK ROM

(75) Inventor: Yi-Ting Wu, Chia-I (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/683,246

(22) Filed: Dec. 5, 2001

(65) Prior Publication Data

US 2003/0104670 A1 Jun. 5, 2003

(51) Int. Cl.[7] ............................................. H01L 21/8247

(52) U.S. Cl. ........................ 438/262; 438/275; 438/307; 438/526; 438/555

(58) Field of Search ................................. 438/262, 263, 438/275, 305, 307, 526, 529, 530, 555

(56) References Cited

U.S. PATENT DOCUMENTS

| | | | | |
|---|---|---|---|---|
| 3,997,367 A | * | 12/1976 | Yau | 438/307 |
| 4,182,023 A | * | 1/1980 | Cohen et al. | 438/555 |
| 6,168,993 B1 | * | 1/2001 | Foote et al. | 438/262 |
| 6,306,780 B1 | * | 10/2001 | Bourdelle et al. | 438/798 |
| 2002/0045331 A1 | * | 4/2002 | Aminpur | 438/585 |
| 2002/0160628 A1 | * | 10/2002 | Okoroanyanwu et al. | 438/795 |

* cited by examiner

*Primary Examiner*—Chandra Chaudhari
(74) *Attorney, Agent, or Firm*—Winston Hsu

(57) ABSTRACT

A patterned photoresist layer is coated onto a semiconductor substrate. Then a doped region is formed in the semiconductor substrate not covered by the patterned photoresist layer. In addition, a semiconductor process is performed to trim the patterned photoresist layer, and a lightly doped drain (LDD) region is formed in the region of the semiconductor substrate next to the doped region. The doped region and the LDD region constitute the buried bit lines of the mask ROM. Finally, the photoresist layer is stripped.

16 Claims, 7 Drawing Sheets

METHOD FOR FABRICATING A MASK ROM

BACKGROUND OF INVENTION

1. Field of the Invention

The present invention relates to a method for fabricating buried bit lines, and more particularly, the present invention relates a method for fabricating buried bit lines of a mask ROM.

2. Description of the Prior Art

A read-only memory (ROM) is a nonvolatile memory where information is permanently stored through the use of custom masks during fabrication. Mask ROMs with buried bit lines (flat cell) are the most popular types of ROM. Conventionally, the buried bit lines are formed by doping impurities into the substrate through a bit line mask. A high-dosage ion implantation process is used to reduce the buried bit line sheet resistance. When the integration increases, i.e. a smaller device size, the buried bit line width, namely the channel critical dimension (CD) also shrinks. Therefore, when the wafer is subjected to high temperature conditions in subsequent processing steps, the doping impurities within the buried bit lines will diffuse outwards and towards one another causing punch-through to take place between adjacent buried bit lines.

In order to prevent punch-through phenomenon between adjacent buried bit lines, a conventional cell punch through (CPT) ion implantation process through a CPT mask is performed to isolate the adjacent buried bit lines and to prevent the diffusion of impurities from the buried bit lines. FIG. 1 to FIG. 2 are schematic diagrams of a conventional method for fabricating buried bit lines 20 of a mask ROM. Referring to FIG. 1, a semiconductor substrate 10 comprising a P-type well 12 is provided. First, the surface of the semiconductor substrate 10 is thermally oxidized to form a pad oxide layer 14 with a thickness between 125 and 250 angstroms (Å). A photoresist layer (not shown) is coated on the pad oxide layer 14 and patterned as is conventional in the art to form a photoresist mask 16 having openings where buried bit lines 20 are to be formed within the semiconductor substrate 10. An ion implantation process 18 is performed through the photoresist mask 16. Typically, arsenic (As) ions are implanted at a dosage of between $1.5 \times 10^{15}$ and $3 \times 10^{15}$ atoms/cm$^2$, and an energy between 40 and 80 KeV to form the buried bit lines 20 within areas of the P-type well 12 which are not shielded by the photoresist mask 16.

Referring to FIG. 2, a CPT halo implantation process 22 is performed through the photoresist mask 16 to form halo regions 24 within the P-type well 12 encompassing the buried bit lines 20. A typical CPT halo ion implantation process 22 implants boron (B) ions at a dosage between $1.2 \times 10^{13}$ and $1.5 \times 10^{13}$ atoms/cm$^2$, and an energy between 100 and 140 KeV. This results in longer lateral diffusion areas 24, which encompass the buried bit lines 20 and are used to isolate the adjacent buried bit lines 20.

The conventional CRT halo ion implantation process 22 is utilized to form the halo regions 24, encompassing the buried bit lines 20 for reducing punch-through phenomenon between the adjacent buried bit lines 20. However, when the mask ROM dimension shrinks, the buried bit line width also shrinks and the buried bit line sheet resistance increases. In addition, the punch-through voltage between the adjacent buried bit lines becomes unacceptably low. Therefore, the high-dosage and the CPT halo ion implantation process 22 are not suitable for preventing punch-through phenomenon between the adjacent buried bit lines 20.

Another method for forming a lightly doped drain (LDD) by utilizing a spacer as a mask is used to prevent punch-through phenomenon. FIG. 3 to FIG. 4 are schematic diagrams depicting a conventional method for fabricating buried bit lines of a mask ROM. Referring to FIG. 3, a semiconductor substrate 30 comprising a P-type well 32 is provided, and a pad oxide layer 34 is formed on the P-type well 32. A patterned photoresist layer 36 is coated on the pad oxide layer 34 to define patterns of buried bit lines (not shown), and then a polysilicon layer 38 is uniformly formed over the semiconductor substrate 30 to fill spaces between the patterned photoresist layer 36.

Referring to FIG. 4, an etching back process is performed to remove portions of the polysilicon layer 36, forming a spacer 40 on a sidewall of the patterned photoresist layer 36. An ion implantation process 42 implants phosphorous (P) ions at a dosage of approximately $1 \times 10^{15}$ atoms/cm$^2$, and an energy between 50 and 100 KeV to form an N$^+$-type doped region 44 within the areas on P-type well 32 which are not shielded by the patterned photoresist layer 36 and the spacer 40. In addition, an N-type doped region 46 is formed within the P-type well 32 beneath the spacer 40. The spacer 40 blocks some of the implanted P ions, therefore the doped region 46 becomes N$^-$. The N$^+$-type doped region 44 and the N-type doped region 46 constitute the buried bit lines of the mask ROM.

In the conventional method, the low-dosage N-doped region positioned at two sides of the buried bit lines formed by utilizing the spacer as the mask are used to prevent punch-through phenomenon between the adjacent buried bit lines. When the bit line width shrinks, the method for fabricating a suitable width spacer between the buried bit line with small channel CD is a main concern in the high-integration semiconductor process. In addition, a conventional pocket ion implantation process is utilized to form a pocket-doped region surrounding the buried bit lines. However, a large tilt-angle ion implantation process is utilized in the smaller bit line width and the thicker photo-resist layer.

SUMMARY OF INVENTION

It is therefore an objective of the present invention to provide a method for fabricating buried bit lines of a mask ROM for reducing electric field strength of the buried bit lines and preventing punch-through phenomenon between the adjacent buried bit lines.

A claimed embodiment of the present invention involves coating a semiconductor substrate with a photoresist layer. The photoresist layer is patterned to form a photoresist pattern with a first line width. A first ion implantation process is performed to form a doped region in the semiconductor substrate not covered by the photoresist pattern. The photoresist pattern is trimmed to shrink the first line width to a second line width by using a resist trimming process in order to expose a region of the semiconductor substrate next to the doped region. A second ion implantation process is performed to form a lightly doped drain (LDD) region in the region of the semiconductor substrate next to the doped region, thus the doped region and the LDD region constitute the buried bit lines of the mask ROM. Then the photoresist layer is stripped.

The present invention utilizes the buried bit lines composed of the doped region and the LDD region of the mask ROM for reducing the buried bit line electric field strength effectively and reducing hot carrier effect. The LDD region positioned at two sides of the buried bit lines increases the punch-through voltage and prevents punch-through phenomenon between the adjacent buried bit lines. In the present invention, a wider channel critical dimension (CD) of the buried bit line is formed, and then a resist trimming process is performed to shrink the channel CD to a demanded critical CD of the semiconductor process. Therefore, the present invention is not limited to smaller devices and is suitable for using in a high-integration semiconductor process or in a high-density memory.

These and other objectives of the present invention will no doubt become obvious to those of ordinary skill in the art after reading the following detailed description of the preferred embodiment that is illustrated in the multiple figures and drawings.

DETAILED DESCRIPTION

Figure 1:
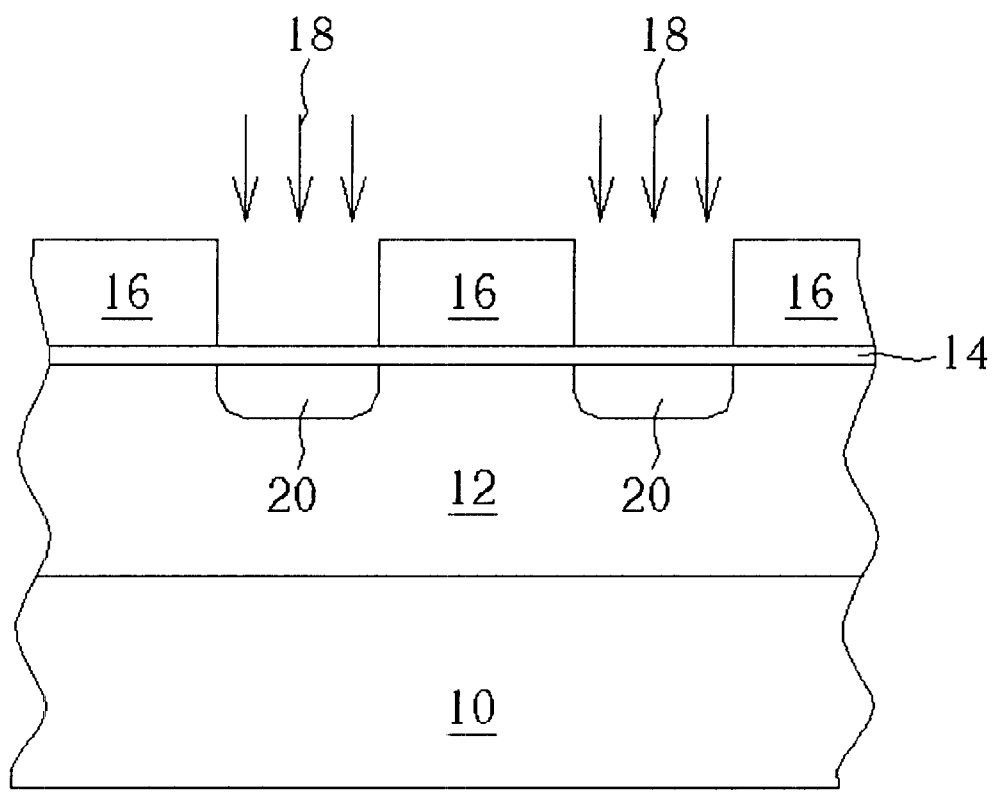
FIG. 1 to FIG. 4 are schematic diagrams showing a conventional method for fabricating buried bit lines of a mask ROM.
Figure 2:
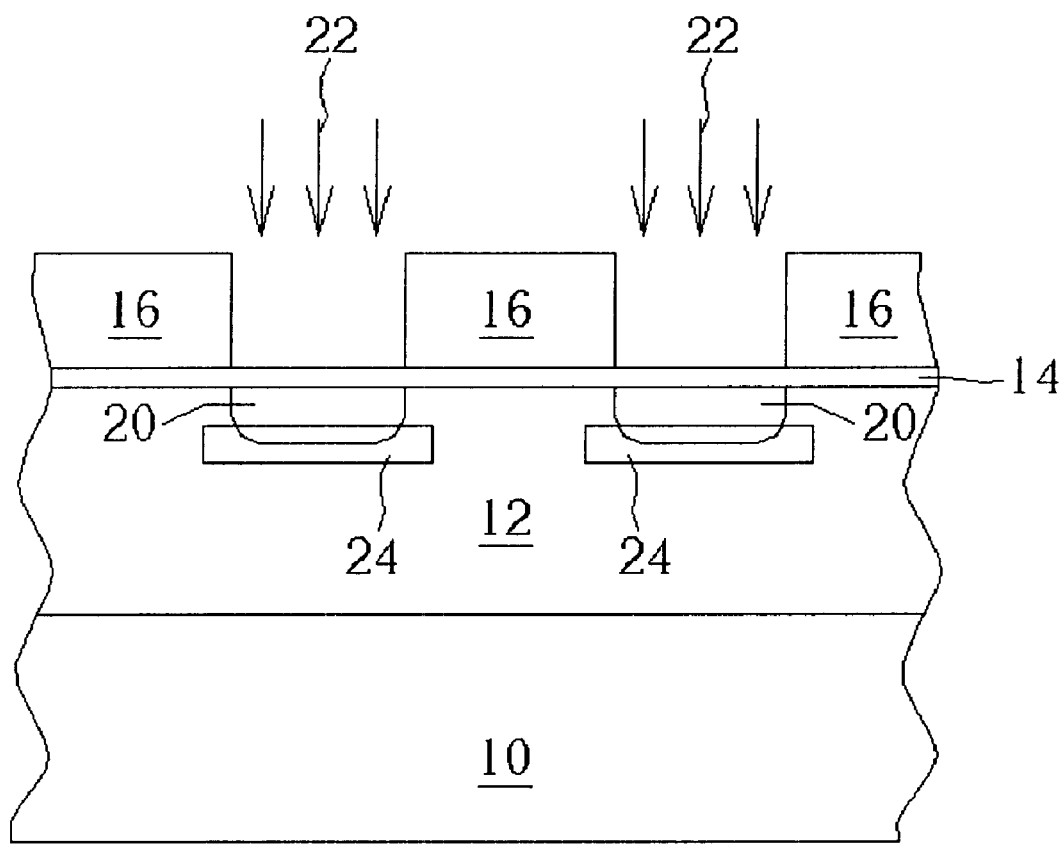
Figure 3:
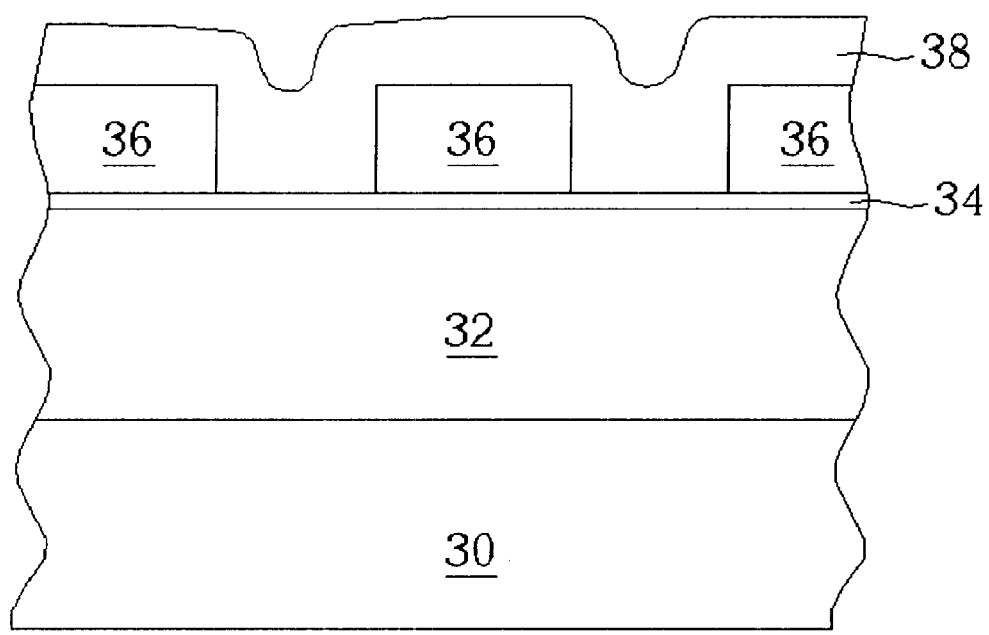
Figure 4:
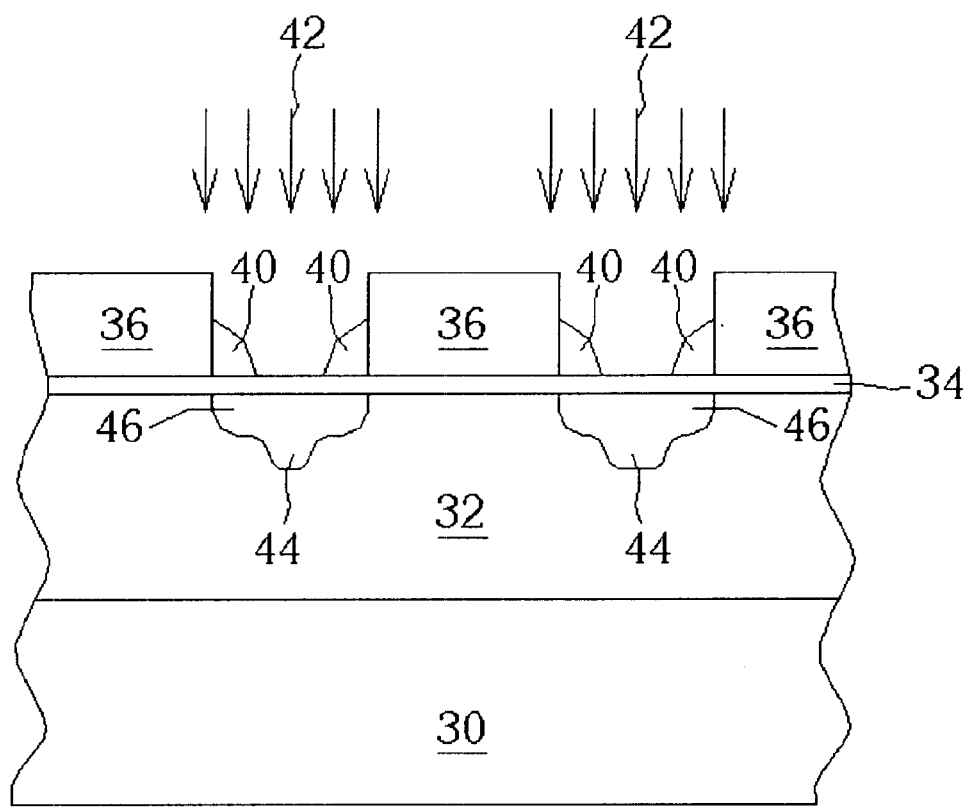
Figure 5:
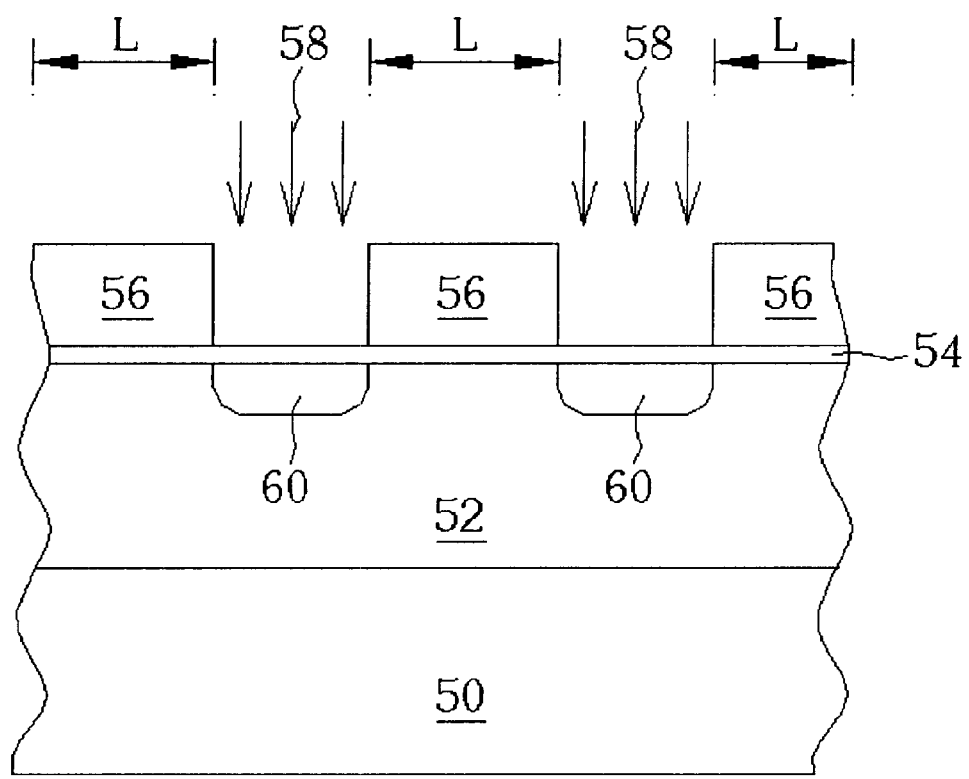
FIG. 5 to FIG. 7 are schematic diagrams for fabricating buried bit lines of the mask ROM according to the present invention.
Figure 6:
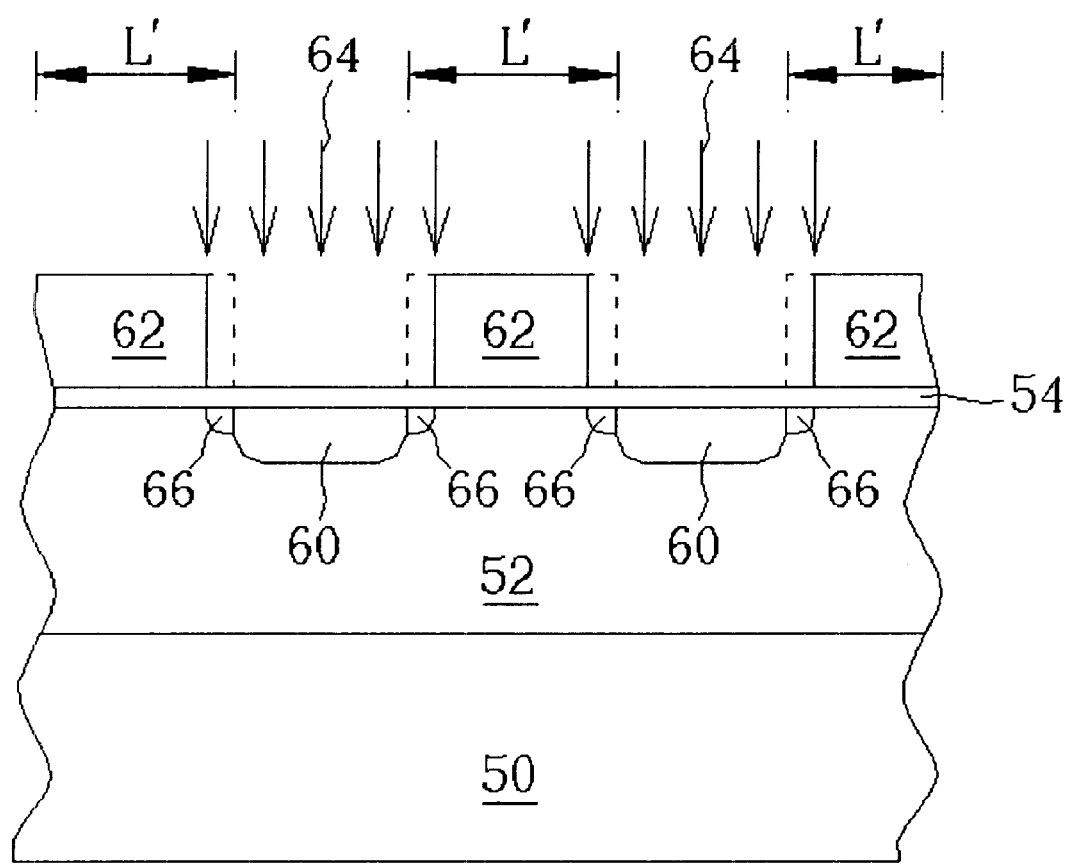
Figure 7:
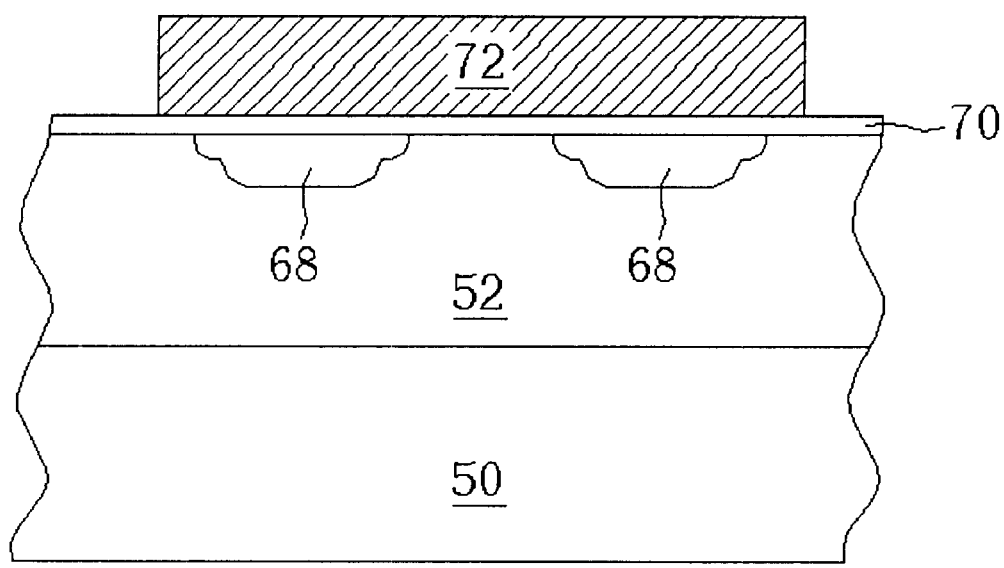

FIG. 5 to FIG. 7 are schematic diagrams for fabricating buried bit lines 68 of the mask ROM according to the present invention. Referring to FIG. 5, a semiconductor substrate 50 comprising a P-type well is provided. A channel CD, which is a line width of the buried bit lines 68 of approximately 0.25 micrometers ($\mu$m) is to be introduced onto it. The surface of the semiconductor substrate 50 is thermally oxidized to form a pad oxide layer 54 with a thickness between 125 and 250 Å. A photoresist layer (not shown) is coated on the pad oxide layer 14 and patterned as is conventional in the art to form a photoresist pattern 56 with a line width L of approximately 0.28 $\mu$m. An ion implantation process 58 is performed to form a doped region 60 within the P-type well 52 not covered by the photoresist pattern 56. Typically, As ions are implanted at a dosage of between $1\times10^{15}$ and $1\times10^{16}$ atoms/cm$^2$, and an energy of between 50 and 100 KeV.

Referring to FIG. 6, a descum process is performed. First, the semiconductor substrate 50 is placed in a plasma chamber (not shown) where the $C_2F_6$, oxygen ($O_2$) and helium (He) are introduced as reaction gases to reduce a width of a part of the two perpendicular sidewalls of the photoresist pattern 56. This shrinks the line width L to a line width L through a plasma dry etching process and exposes a region of the semiconductor substrate 50 next to the doped region 60. The width is between 0.005 and 0.05 $\mu$m, and a preferred value is approximately 0.3 $\mu$m in the present invention. Therefore, the line width L of a trimmed photoresist pattern 62 is approximately 0.25 $\mu$m. Then, an ion implantation process 64 implants As ions to form a LDD region 66 in the region of the semiconductor substrate 50 next to the doped region 60. Typically, both dosage and energy of dopants used in the ion implantation process 64 are lower than that of the ion implantation process 58. The doped region 60 and the LDD region 66 constitute the buried bit lines 68 of the mask ROM.

The descum process can be a ultra-violet (UV) light irradiation process. The UV light irradiation process is performed by using a UV light with a wavelength between 360 and 420 nanometers (nm), and a preferred value of approximately 365 nm, with an amount of irradiation between 1400 and 40000 mJ/cm$^2$ to light the semiconductor substrate 50 for evaporating photoresist solvents or organic materials in the photoresist pattern 56, thus the photoresist pattern 56 is cured. During the UV light irradiation process, a weight of the photoresist pattern 56 decreases by 20%, and a volume of the photoresist pattern 56 decreases by 10%. In addition, a thermal curing process is used instead of the descum process to heat the semiconductor substrate 50 at a temperature between 70 and 250° C. for trimming the photoresist pattern 56.

Referring to FIG. 7, the trimmed photoresist pattern 62 and the pad oxide layer 54 are stripped. A gate oxide layer 70 with a thickness between 90 and 150 Å is formed on the semiconductor substrate 50. A polysilicon layer (not shown) is formed on the semiconductor substrate 50 and patterned to form a polysilicon gate, functioning as a word line 70 of the mask ROM. Thus the method for fabricating the mask ROM in the present invention is complete.

In simplified terms, the photoresist pattern 56 with a wider line width, such as approximately 0.28 $\mu$m, is first formed on the semiconductor substrate 50 to define the channel CD of the buried bit line 68, and then the ion implantation process 58 is performed to form the doped region 60 within the P-type ion well 52. In addition to the descum process, the UV light irradiation process or the thermal curing process is utilized to shrink the width of part of the two perpendicular sidewalls, thus the line width of the photoresist pattern 62 becomes approximately 0.25 $\mu$m. Finally, the ion implantation process 64 is performed to form the LDD region 66. The doped region 60 and the LDD region 66 constitute the buried bit lines 68 of the mask ROM.

In comparison with the conventional techniques, the present invention utilizes the doped region composed of the LDD region and the doped region as the buried bit lines of the mask ROM for reducing the buried bit lines electric field strength effectively and for hot carrier effect. The LDD region increases the punch-through voltage and prevents punch-through phenomenon between the adjacent buried bit lines. In the present invention, the channel CD of the buried bit line is formed wider, and then a resist trimming process is performed to shrink the channel CD to a demanded critical CD. Therefore, the present invention is not limited in smaller devices and is suitable for utilization in a high-integration semiconductor process.

Those skilled in the art will readily observe that numerous modification and alterations of the device may be made while retaining the teachings of the invention. Accordingly, the above disclosure should be construed as a limited only by the metes and bounds of the appended claims.

What is claimed is:

1. A method for fabricating buried bit lines of a mask ROM, the method comprising:

providing a semiconductor substrate with a photoresist layer coated on the semiconductor substrate;

patterning the photoresist layer to form a photoresist pattern with a first line width;

performing a first ion implantation process to form a doped region in the semiconductor substrate not covered by the photoresist pattern;

trimming the photoresist pattern to shrink the first line width to a second line width by using an ultra-violet (UV) light irradiation process so as to expose a region of the semiconductor substrate next to the doped region;

performing a second ion implantation process to form a lightly doped drain (LDD) region in the region of the semiconductor substrate next to the doped region, the doped region and the LDD region being implanted with same type dopants and constituting the buried bit lines of the mask ROM; and stripping the photoresist layer.

2. The method of claim 1 wherein the UV light irradiation process is performed by using a UV light with a wavelength between 360 and 420 nm.

3. The method of claim 1 wherein the UV light irradiation process is a thermal curing process.

4. The method of claim 3 wherein the thermal curing process is performed at a temperature between 70 and 250° C.

5. The method of claim 1 wherein the UV light irradiation process is a descum process.

6. The method of claim 5 wherein the photoresist pattern comprises two substantially perpendicular sidewalls, the distance between the two sidewalls defining the first line width, the descum process comprising:

placing the semiconductor substrate in a plasma chamber; and performing a dry etching process in the plasma chamber to reduce a width of part of the photoresist pattern.

7. The method of claim 1 wherein the difference between the first line width and the second line width is between 0.0005 and 0.05 micrometers.

8. The method of claim 1 wherein the first ion implantation process utilizes dopants selected from elements in the VA group having a dosage between $1 \times 10^{15}$ and $1 \times 10^{16}$ atoms/cm$^2$, and an energy between 50 and 180 KeV.

9. The method of claim 1 wherein both dosage and energy of dopants used in the second ion implantation process are lower than that of the first ion implantation process.

10. A method for fabricating buried bit lines on a semiconductor substrate, the method comprising:

forming a patterned photoresist layer on the semiconductor substrate;

performing a first ion implantation process to form a source/drain (S/D) region in the semiconductor substrate not covered by the patterned photoresist layer;

performing a thermal curing process to reduce a width of part of the patterned photoresist layer so as to expose a region of the semiconductor substrate next to the S/D region;

performing a second ion implantation process after the thermal curing process to form lightly doped drain (LDD) region in the region of the semiconductor substrate next to the S/D region, the S/D region and the LDD region being implanted with same type dopants; and stripping the photoresist layer.

11. The method of claim 10 wherein the thermal curing process is an ultra-violet (UV) light irradiation process.

12. The method of claim 11 wherein the UV light irradiation process is performed by using a UV light with a wavelength between 360 and 420 nm.

13. The method of claim 10 wherein the thermal curing process is performed at a temperature between 70 and 250° C.

14. The method of claim 10 wherein the width is between 0.0005 and 0.05 micrometers.

15. The method of claim 10 wherein the first ion implantation process utilizes dopants selected from elements in the VA group having a dosage between $1 \times 10^{15}$ and $1 \times 10^{16}$ atoms/cm$^2$, and an energy between 50 and 180 KeV.

16. The method of claim 10 wherein both dosage and energy of dopants used in the second ion implantation process are lower than that of the first ion implantation process.

* * * * *